(12) United States Patent
Frosien

(10) Patent No.: US 10,297,418 B2
(45) Date of Patent: May 21, 2019

(54) METHOD OF REDUCING COMA AND CHROMATIC ABERRATION IN A CHARGED PARTICLE BEAM DEVICE, AND CHARGED PARTICLE BEAM DEVICE

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 327 days.

(21) Appl. No.: 14/798,893

(22) Filed: Jul. 14, 2015

(65) Prior Publication Data
US 2017/0018402 A1    Jan. 19, 2017

(51) Int. Cl.
| | | |
|---|---|---|
| *H01J 37/26* | (2006.01) | |
| *H01J 37/145* | (2006.01) | |
| *H01J 37/153* | (2006.01) | |
| *H01J 37/21* | (2006.01) | |
| *H01J 37/147* | (2006.01) | |

(52) U.S. Cl.
CPC .......... *H01J 37/261* (2013.01); *H01J 37/145* (2013.01); *H01J 37/153* (2013.01); *H01J 37/21* (2013.01); *H01J 37/1478* (2013.01); *H01J 2237/1507* (2013.01); *H01J 2237/1508* (2013.01); *H01J 2237/1534* (2013.01)

(58) Field of Classification Search
None
See application file for complete search history.

(56) References Cited

U.S. PATENT DOCUMENTS

| | | | | |
|---|---|---|---|---|
| 6,452,175 | B1* | 9/2002 | Adamec | H01J 37/1478 250/310 |
| 2006/0049348 | A1* | 3/2006 | Petrov | G01N 23/2204 250/307 |
| 2007/0085018 | A1* | 4/2007 | Zhou | H01J 37/06 250/396 R |
| 2008/0258060 | A1* | 10/2008 | Frosien | H01J 37/1478 250/310 |
| 2010/0301211 | A1* | 12/2010 | Miller | H01J 37/09 250/307 |
| 2011/0114852 | A1* | 5/2011 | Henstra | H01J 37/153 250/396 R |
| 2011/0291007 | A1* | 12/2011 | Wang | H01J 37/244 250/307 |

(Continued)

*Primary Examiner* — James Choi
(74) *Attorney, Agent, or Firm* — Kilpatrick Townsend & Stockton LLP

(57) ABSTRACT

The present disclosure provides a method of reducing coma and chromatic aberration in a charged particle beam device for providing a beam tilt of a charged particle beam. The method includes tilting the charged particle beam with a deflection assembly consisting of two or more electrostatic deflection elements, wherein at least one deflection element of the two or more deflection elements is a post-lens deflector, while the charged particle beam is guided through an essentially coma-free z-position of an objective lens, and reducing off-axis chromatic aberrations with a magnetic deflection element, wherein tilting the charged particle beam reduces coma independent of off-axis chromatic aberrations.

23 Claims, 7 Drawing Sheets

(56) References Cited

U.S. PATENT DOCUMENTS

| | | | |
|---|---|---|---|
| 2012/0006997 A1* | 1/2012 | Frosien | H01J 37/1471 |
| | | | 250/396 ML |
| 2014/0054468 A1* | 2/2014 | Hosokawa | H01J 37/153 |
| | | | 250/396 R |
| 2014/0070098 A1* | 3/2014 | Sytar | H01J 37/145 |
| | | | 250/307 |
| 2014/0151552 A1* | 6/2014 | Jiang | H01J 37/263 |
| | | | 250/307 |
| 2016/0329189 A1* | 11/2016 | Sears | H01J 37/28 |

* cited by examiner

METHOD OF REDUCING COMA AND CHROMATIC ABERRATION IN A CHARGED PARTICLE BEAM DEVICE, AND CHARGED PARTICLE BEAM DEVICE

FIELD

Embodiments of the present disclosure relate to a method of reducing coma and chromatic aberration in a charged particle beam device for providing a beam tilt of a charged particle beam, and a charged particle beam device. Embodiments of the present disclosure particularly relate to charged particle beam devices, for example, for inspection of 3D structures.

BACKGROUND

Charged particle beam devices have many functions, in a plurality of industrial fields, including, but not limited to, electron beam inspection, critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to their short wavelengths.

Imaging of 3D structure, such as V-NAND devices, FinFets and deep vias has been paid attention to. In the imaging of 3D structures, a high resolution and a high throughput of the charged particle beam device are beneficial. As an example, the resolution can be affected by aberrations introduced in the charged particle beam by the optical system of the charged particle beam device. Further, in CD measurements it can be beneficial to measure all three dimensions.

In view of the above, new methods of reducing aberrations such as coma and chromatic aberration in a charged particle beam device and charged particle beam devices that overcome at least some of the problems in the art are beneficial. In particular, methods and charged particle beam devices providing an improved resolution and an increased throughput are beneficial.

SUMMARY

In light of the above, a method of reducing coma and chromatic aberration in a charged particle beam device for providing a beam tilt of a charged particle beam and a charged particle beam device are provided. Further aspects, benefits, and features of the present disclosure are apparent from the claims, the description, and the accompanying drawings.

According to an aspect of the present disclosure, a method of reducing coma and chromatic aberration in a charged particle beam device for providing a beam tilt of a charged particle beam is provided. The method includes tilting the charged particle beam with a deflection assembly consisting of two or more electrostatic deflection elements, wherein at least one deflection element of the two or more deflection elements is a post-lens deflector, while the charged particle beam is guided through an essentially coma-free z-position of an objective lens, and reducing off-axis chromatic aberrations with a magnetic deflection element, wherein tilting the charged particle beam reduces coma independent from off-axis chromatic aberrations.

According to another aspect of the present disclosure, a charged particle beam device is provided. The charged particle beam device includes a charged particle beam emitter for emitting a primary charged particle beam, a specimen stage for supporting a specimen, an objective lens for focusing the charged particle beam onto the specimen and defining an optical axis providing a z-coordinate, a first electrostatic deflection element at a first z-position, wherein the first z-position is between the charged particle beam emitter and the objective lens, wherein the first electrostatic deflection element is an n-pole with $n \geq 4$, wherein the first electrostatic deflection element deflects the charged particle beam away from the optical axis to a first off-axis position, a second electrostatic deflection element at a second z-position, wherein the second z-position is between the first z-position and an essentially coma-free z-position provided by the objective lens, wherein the second electrostatic deflection element is an n-pole with $n \geq 8$, and wherein the second electrostatic deflection element deflects the charged particle beam from the first off-axis position to a second off-axis position, wherein the optical axis is between the first off-axis position and the second off-axis position, a third electrostatic deflection element at a third z-position, wherein the third z-position is between the objective lens and the specimen stage, wherein the third electrostatic deflection element is an n-pole with $n \geq 4$, and a magnetic deflection element, which is provided between the objective lens and the charged particle beam emitter, wherein the magnetic deflection element is an n-pole with $n \geq 4$, wherein the magnetic deflection element introduces a compensating dispersion, which reduces the chromatic aberration introduced by the second off-axial position of the charged particle beam within the objective lens.

According to yet another aspect of the present disclosure, a charged particle beam device is provided. The charged particle beam device includes a charged particle beam emitter for emitting a primary charged particle beam, a specimen stage for supporting a specimen, an objective lens for focusing the charged particle beam onto the specimen and defining an optical axis providing a z-coordinate, means for tilting the charged particle beam along a beam path, which passes through or near an essentially coma-free z-position of the objective lens and which has a first off-axis position and a second off-axis position, wherein the means for tilting consists of two or more electrostatic deflection elements, wherein at least one deflection element of the two or more deflection elements is a post-lens deflector, and means for compensating off-axis chromatic aberrations, wherein the means for compensating includes at least one magnetic deflection element, wherein the means for tilting the charged particle beam reduces the coma independent of off-axis chromatic aberrations.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1A:
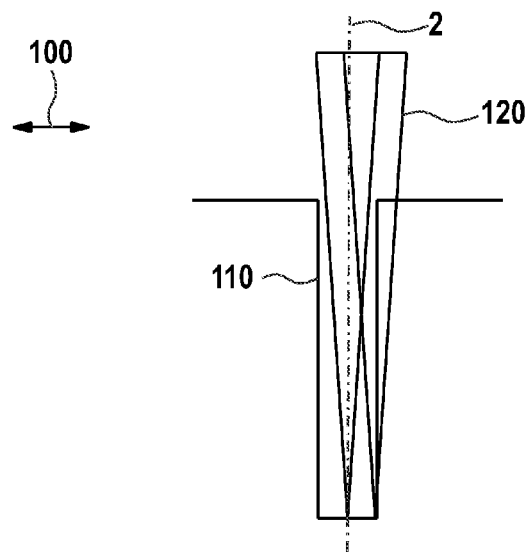
FIGS. 1A to C show schematic views of an imaging of 3D structures according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography of the specimen, its chemical constituents, its electrostatic potential and others. The secondary electrons can include at least one of back-scattered electrons and Auger electrons. The signal charged particles can be collected and guided to a sensor, e.g., a scintillator, a pin diode or the like.

In the imaging of 3D structures, such as V-NAND devices, FinFets and deep vias, a high resolution and a high throughput are beneficial. As an example, a resolution provided by a charged particle beam device can be affected by aberrations, such as coma and chromatic aberration, caused by the optical system of the charged particle beam device. The present disclosure provides a method and a charged particle beam device that use two or more electrostatic deflection elements and one or more magnetic deflection elements for independently reducing coma and off-axis chromatic aberration, respectively. The two or more electrostatic deflection elements guide the charged particle beam (e.g., the primary charged particle beam) through an essentially coma-free z-position of an objective lens to reduce the coma. The magnetic deflection element introduces a compensating dispersion in the charged particle beam to reduce the chromatic aberration. Reducing the coma and chromatic aberration particularly provides for an improved resolution of the charged particle beam device. Further, the two or more electrostatic deflection elements allow for a fast stetting or changing of the beam tilt and a throughput of the charged particle beam device can be increased. According to some embodiments, independently reducing coma and off-axis chromatic aberration can refer to a reduction of coma and off-axis chromatic aberration using distinct deflection systems, such as the two or more electrostatic deflection elements and the one or more magnetic deflection elements, respectively. In some implementations, the deflection systems can be operated independently from each other.

Figure 1B:
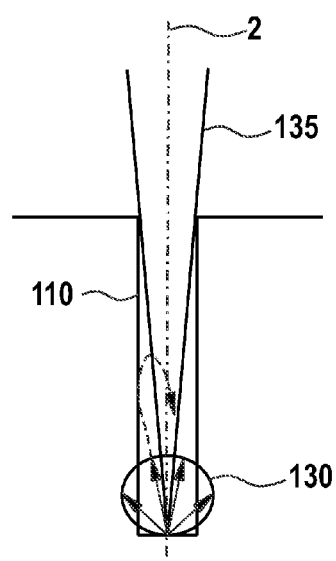
Figure 1C:
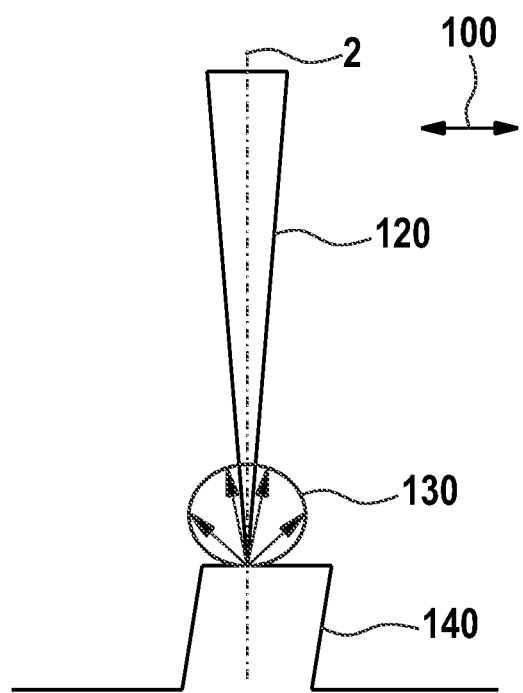

FIGS. 1A to C show schematic views of 3D structures that can be inspected with a charged particle beam device. FIGS. 1A and B show deep vias 110 and FIG. 1C shows a raising structure 140, e.g., a FinFet. A charged particle beam 120 with vertical incidence is used for imaging the 3D structures. The term "vertical incidence" can be understood in a sense that the charged particle beam 120 is substantially parallel to an optical axis 2 of the charged particle beam device. The optical axis 2 can extend along a z-direction. The term "substantially parallel" relates to a substantially parallel orientation e.g. of the charged particle beam 120 and the optical axis 2, wherein a deviation of a few degrees, e.g. up to 1° or even up to 2°, from an exact parallel orientation is still considered as "substantially parallel". In FIGS. 1A and 1C, the charged particle beam 120 is scanned over the structure to be imaged in a scanning direction 100. FIG. 1B illustrates a signal charged particle distribution 130, wherein the signal charged particles can escape from the deep via 110 as indicated with the lines 135.

As illustrated in FIGS. 1A to C, an imaging of corner regions of deep vias 110 and side walls of raising structures 140 using the charged particle beam 120 with vertical incidence can be challenging. A tilting of the charged particle beam with respect to the optical axis 2 can be used, for example, for top views and views from different directions. A static tilt as well as dynamic tilt (e.g., in a rocking beam imaging) can be used. As an example, a tilting of the charged particle beam can have at least two operation modes. First, a static beam tilt can be used which allows for an observation (e.g., beam scanning) under a constant observation angle. The result is an image which gives the impression of looking onto the specimen under a certain angle (incident angle of the charged particle beam). Second, a dynamic beam tilt can use a scan ("rocking beam method") which overlays scan and beam tilt. The charged particle beam is tilted by the deflection elements in a pivot point which is located in z-direction on the optical axis 2. By choosing the pivot point in front of or behind the specimen surface, specific imaging characteristics can be enabled. Examples for the operation modes are illustrated in FIGS. 3 to 5.

Tilting of the charged particle beam can, for example, cause aberrations of the charged particle beam, such as coma and chromatic aberration. The present disclosure provides a method and a charged particle beam device that use two or more electrostatic deflection elements and a magnetic deflection element for independently reducing coma and chromatic aberration, respectively. The two or more electrostatic deflection elements guide the charged particle beam through an essentially coma-free z-position of an objective lens to reduce the coma. The magnetic deflection element introduces a compensating dispersion to reduce the chromatic aberration.

As used throughout the present disclosure, the term "coma-free z-position" or "coma-free point" refers to a point of (or provided by) the objective lens at which minimum or even no coma is introduced in the charged particle beam when the charged particle beam passes through the objective lens. The coma-free point of the objective lens is a point of the objective lens at which the Fraunhofer condition (condition that the coma is zero) is satisfied. The coma-free point of the objective lens is located on a z-axis of the optical system of the charged particle beam device. The z-axis can correspond to the optical axis 2. In other words, the coma-free point of the objective lens is located on the optical axis 2. The coma-free z-position or coma-free point can be positioned within the objective lens, e.g., at a position between the charged particle beam emitter and a lens center or a lens field center. In other words, the coma-free z-position or coma-free point can be positioned in front of the lens center or a lens field center, for example, a magnetic and/or electric field center. As an example, the coma-free z-position or coma-free point can be in front of a maximum of a magnetic field and/or an electric field of the objective lens. In some implementations, the coma-free z-position or coma-free point can be surrounded by the objective lens.

According to some embodiments, which can be combined with other embodiments described herein, the objective lens can have one or more principal planes, for example, a first principle plane relating to the object side (e.g., a charged particle emitter side) and/or a second principle plane relating to the image side (e.g., a specimen side). The coma-free z-position or coma-free point can be positioned between the first principle plane and the focal plane of the objective lens related to the object side. Specifically, the coma-free z-position or coma-free point can be closer to the first principal plane than to the focal plane.

The term "essentially coma-free" should be understood in a sense that the essentially coma-free z-position or essentially coma-free point may be not completely coma-free and that some coma can be introduced in the charged particle beam. However, the coma introduced in the charged particle beam which passes through the essentially coma-free z-position or coma-free point is less than a coma introduced in the charged particle beam which passes through other points of the objective lens away from the essentially coma-free z-position or coma-free point.

The present embodiments particularly allow for a beam tilt with reduced or even no loss in resolution (e.g., increase in probe diameter) compared to a charged particle beam with vertical incidence as shown in FIGS. 1A to C. In order to create 3D images with significant z-information, large beam tilt angles up to 30 degrees can be provided. Based on specimen topography also smaller tilt angles could be used, for example, 15 degrees or 10 degrees. The two or more electrostatic deflection elements allow for a fast beam tilt, e.g., for the rocking beam operation mode, and a throughput of the charged particle beam device can be increased. As an example, the beam tilt angles can be changed with short setting times. The present disclosure further provides for a high accuracy of setting and/or calibrating the beam tilt angle for improved 3D measurements.

A "specimen" as referred to herein, includes, but is not limited to, semiconductor wafers, semiconductor workpieces, and other workpieces such as memory disks and the like. Embodiments of the disclosure may be applied to any workpiece on which material is deposited or workpiece which is structured. The structure can be a 3D-structure, such as V-NAND devices, FinFets and deep vias.

Figure 2:
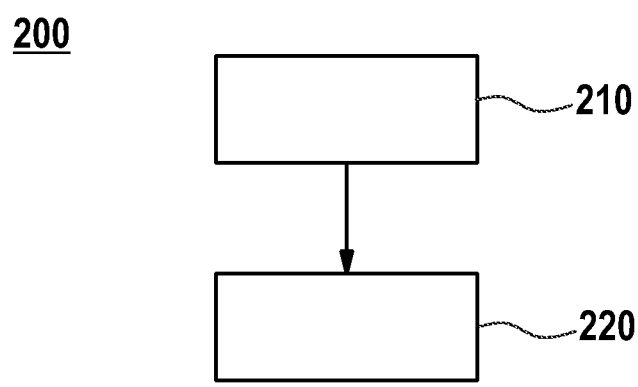
FIG. 2 shows a flowchart of a method of reducing coma and chromatic aberration in a charged particle beam device for providing a beam tilt of a charged particle beam according to embodiments described herein.

FIG. 2 shows a flowchart of a method 200 of reducing coma and chromatic aberration in a charged particle beam device for providing a beam tilt of a charged particle beam according to embodiments described herein.

The method 200 includes in block 210 a tilting of the charged particle beam with a deflection assembly consisting of two or more electrostatic deflection elements, wherein at least one deflection element of the two or more deflection elements is a post-lens deflector, while the charged particle beam is guided through an essentially coma-free z-position of an objective lens. The method 200 includes in block 220 a reduction of off-axis chromatic aberrations with a magnetic deflection element. The tilting of the charged particle beam reduces coma independent of off-axis chromatic aberrations.

According to some embodiments, which can be combined with other embodiments described herein, the method further includes a scanning of the charged particle beam with the deflection assembly consisting of the two or more electrostatic deflection elements. As an example, the charged particle beam can be tilted statically or dynamically and can be scanned over the specimen to be imaged.

In some implementations, reducing the off-axis chromatic aberration with the magnetic deflection element includes introducing a compensating dispersion by the magnetic deflection element. The compensating dispersion can reduce or compensate the chromatic aberration introduced within the objective lens. As an example, the compensation dispersion can be introduced using an ExB-type configuration including the magnetic deflection element. According to some embodiments, the ExB-type configuration can provide an electric field and a magnetic field. The electric field and the magnetic field can be substantially perpendicular to the optical axis 2. Additionally or alternatively, the electric field and the magnetic field and can be substantially perpendicular to each other. The term "substantially perpendicular" relates to a substantially perpendicular orientation e.g. of the fields and the optical axis 2 or the fields with respect to each other, wherein a deviation of a few degrees, e.g. up to 5° or even up to 10°, from an exact perpendicular orientation is still considered as "substantially perpendicular".

According to some embodiments, which can be combined with other embodiments described herein, a beam tilt angle of the charged particle beam with respect to the optical axis after the objective lens is in a range of 5 to 30 degrees. In some implementations, the beam tilt angle is at least 10 degrees, specifically at least 15 degrees, and more specifically at least 20 degrees. The beam tilt angle can be less than 30 degrees. As an example, the beam tilt angle can be about 10 or about 15 degrees. The method and charged particle beam devices can provide a high resolution even for large beam tilt angles, e.g., up to 30 degrees. The beam tilt angle can define, or be, a landing angle of the charged particle beam on the specimen to be imaged.

The beam tilt can use an off-axis travel of the charged particle beam and optionally an objective lens with a short focal length. A tilted penetration through the objective lens followed by a post lens deflection provides for an aberration optimization to achieve a high resolution. In particular, a tilted penetration through the objective lens can cause off-axis chromatic aberration that can result in spot size deterioration. Further, coma can make a contribution to the final probe size due to the tilted penetration of the charged particle beam through the objective lens. The present disclosure provides for an independent compensation of both contributions, namely off-axis chromatic aberration and coma. Off-axis chromatic aberration correction can be done by an ExB-type dispersion element including the magnetic deflection element acting on the charged particle beam between source and objective lens. Coma can be compensated or reduced by a double deflecting system including the two or more electrostatic deflection elements which provides a beam path crossing through (or near) the coma free point of the objective lens.

The two or more electrostatic deflection elements allow for a fast switching of the beam tilt angle. The two or more electrostatic deflection elements can avoid eddy currents, which can be a limiting factor in magnetic deflection configurations used for beam tilts. Also hysteresis can be avoided which can influence beam tilt angle accuracy. The post lens deflector, e.g., the third electrostatic deflection element, can generate and define a landing angle of the charged particle beam on the specimen and can allow for large beam tilt angles.

The embodiments of the present disclosure can provide at least some of the following benefits. Some of the deflection elements are electrostatic deflection elements that can meet speed requirements or specifications. Eddy currents and hysteresis can be avoided. Aberrations (off-axis chromatic aberration and coma) are reduced or compensated by independent components which allow for flexible and accurate aberration compensation. According to some embodiments, which can be combined with other embodiments described herein, the deflection elements are not superimposed onto the objective lens and do not impact the design and optimization of the objective lens. Using the deflection elements (electrostatic deflection elements and magnetic deflection element) enables the realization of a short column which is particularly beneficial in high current SEMs (e.g. in EBI) to reduce or even avoid reduce electron-electron interaction. As an example, an additional lens for letting the deflected charged particle beam pass therethrough before the charged particle beam passes off-axis through the objective lens can be omitted. In particular, an additional lens for compensating coma by said additional lens can be avoided when using short columns.

According to some embodiments, which can be combined with other embodiments described herein, the method of the present disclosure can reduce or correct at least one coma of the objective lens and coma of one or more further coma sources. The one or more further coma sources can include, but are not limited to, at least one of the two or more electrostatic deflection elements and a lens of the optical system of the charged particle beam device. In particular, the method can introduce or correct coma of the objective lens and optionally can introduce coma to correct other coma sources in a ray path, like coma of the electrostatic deflection elements in the overall tilt configuration and/or other lenses involved in the optical system. In some implementations, the pivot point (e.g., at a position indicated with reference numeral "372" in FIG. 3A) can be selected such that positive and/or negative coma is introduced in the primary charged particle beam passing the objective lens (e.g., positive and/or negative contributions to the overall coma introduced by the objective lens). In particular, the pivot point can be selected such that the positive and/or negative coma introduced by the objective lens reduces or corrects coma of the one or more further coma sources. The pivot point can be defined as a point where the primary charged particle beam crosses the optical axis.

According to embodiments described herein, the method of reducing coma and chromatic aberration in a charged particle beam device for providing a beam tilt of a charged particle beam can be conducted by means of computer programs, software, computer software products and the interrelated controllers, which can have a CPU, a memory, a user interface, and input and output means being in communication with the corresponding components of the charged particle beam device.

Figure 3A:
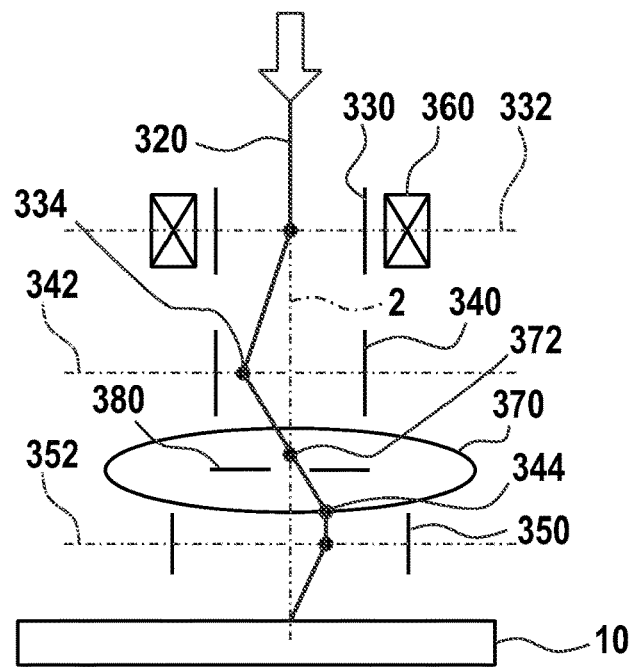
FIG. 3A shows a schematic view of a charged particle beam device according to embodiments described herein.

FIG. 3A shows a schematic view of a charged particle beam device according to embodiments described herein.

The charged particle beam device includes a charged particle beam emitter (not shown) for emitting a charged particle beam 320, a specimen stage for supporting a specimen 10, and an objective lens 370 for focusing the charged particle beam onto the specimen 10. The objective lens 370 defines the optical axis 2 and provides a z-coordinate. As an example, the optical axis 2 can be a straight optical axis. The two or more electrostatic deflection elements of the charged particle beam device can be configured to deflect the charged particle beam away from, or towards, the optical axis 2. The objective lens 370 can be magnetic, electrostatic, or combined electrostatic-magnetic.

The charged particle beam device includes a first electrostatic deflection element 330, a second electrostatic deflection element 340, and a third electrostatic deflection element 350. The third electrostatic deflection element 350 is a post-lens deflector. The first electrostatic deflection element 330 and the second electrostatic deflection element 340 are pre-lens deflectors. The first electrostatic deflection element 330 and the second electrostatic deflection element 340 can also be referred to as "double deflector". The first electrostatic deflection element 330 and the second electrostatic deflection element 340 can be configured for deflecting the charged particle beam to guide the charged particle beam 320 through (or near) the essentially coma-free z-position 372 of the objective lens 370. The third electrostatic deflection element 350 can be configured to define a landing angle of the charged particle beam 320 on the specimen 10.

The first electrostatic deflection element 330 is provided at a first z-position 332. The first z-position 332 is between the charged particle beam emitter and the objective lens 370. The first electrostatic deflection element 330 is configured to deflect the charged particle beam 320 away from the optical axis 2 to a first off-axis position 334. The first off-axis position 334 can be offset from the optical axis 2 in a direction perpendicular to the optical axis 2.

The second electrostatic deflection element 340 is provided at a second z-position 342. The second z-position 342 is between the first z-position 332 and an essentially coma-free z-position 372 provided by the objective lens 370, wherein the second electrostatic deflection element 340 deflects the charged particle beam 320 from the first off-axis position 334 to a second off-axis position 344. As an example, the second z-position 342 can be provided between the first z-position 332 and the objective lens 370. The second off-axis position 344 can be a position within the objective lens 370. The optical axis 2 is between the first off-axis position 334 and the second off-axis position 344. The charged particle beam 320 is guided (or travels) along an optical path between the first off-axis position 334 and the second off-axis position 344. The optical path connects the first off-axis position 334 and the second off-axis position 344. The optical path crosses or nearly crosses through the coma-free z-position 372 of the objective lens 370.

The third electrostatic deflection element 350 is provided at a third z-position 352. The third z-position 352 is between the objective lens 370 and the specimen stage or specimen 10. The third electrostatic deflection element 350 can be configured to define a landing angle of the charged particle beam 320 on the specimen 10. As an example, the landing angle can be in a range of 5 to 30 degrees. In some implementations, the landing angle is at least 10 degrees, specifically at least 15 degrees, and more specifically at least 20 degrees. The landing angle can be less than 30 degrees. As an example, the landing angle can be about 10 or about 15 degrees. According to some embodiments, the landing angle can correspond to the beam tilt angle of the charged particle beam 320 with respect to the optical axis 2 after the objective lens 370. In some implementations, the third electrostatic deflection element 350 can be an independent element or can be combined with, for example, a proximity electrode configured for defining an extraction field for the signal charged particles.

In some implementations, the first electrostatic deflection element 330 is an n-pole with n≥4 and/or the second electrostatic deflection element 340 is an n-pole with n≥8 and/or the third electrostatic deflection element 350 is an n-pole with n≥4. The multipole configuration can allow for an accurate deflection of the charged particle beam 320. According to some embodiments, at least one of the first electrostatic deflection element 330, the second electrostatic deflection element 340 and the third electrostatic deflection element 350 is configured for statically or dynamically scanning the charged particle beam over the specimen 10.

In the charged particle beam device and the method according to the embodiments described herein, the charged particle beam 320 is deflected away from the optical axis 2 to the first off-axis position 334 by the first electrostatic deflection element 330 at the first z-position 332, wherein the first z-position 332 is between the charged particle beam emitter and the objective lens 370. The charged particle beam 320 is further deflected from the first off-axis position 334 to the second off-axis position 344 by the second electrostatic deflection element 340 at the second z-position 342, wherein the second off-axis position 344 is in the objective lens 370, and wherein the optical axis 2 is between the first off-axis position 334 and the second off-axis position 344. The charged particle beam 320 is deflected by the third electrostatic deflection element 350 at the third z-position 352, wherein the third z-position 352 is between the objective lens 370 and the specimen stage or specimen 10.

The charged particle beam device includes a magnetic deflection element 360. The magnetic deflection element 360 is provided between the objective lens 370 and the charged particle beam emitter. As an example, the magnetic deflection element 360 is provided between the second electrostatic deflection element 340 and the charged particle beam emitter. In some implementations, the magnetic deflection element 360 is an n-pole with n≥4. The magnetic deflection element 360 can be configured for generation of a magnetic field that is substantially perpendicular to the optical axis 2. The magnetic field direction of the magnetic deflection element 360 can be substantially perpendicular to the electric field direction of the first electrostatic deflection element 330. The magnetic deflection element 360 introduces a compensating dispersion, which reduces the chromatic aberration introduced by the second off-axis position 344 of the charged particle beam 320 within the objective lens 370.

According to some embodiments, which can be combined with other embodiments described herein, the magnetic deflection element 360 is positioned at the first z-position 332. In the example of FIG. 3A, the first electrostatic deflection element 330 of the double deflector is common with the magnetic deflection element 360, which can be included in an ExB device. In some embodiments, the magnetic deflection element 360 surrounds the first electrostatic deflection element 330. The magnetic deflection element 360 and the first electrostatic deflection element 330 can be integrated in a single entity. As an example, the magnetic deflection element 360 and the first electrostatic deflection element 330 can be integrated in, or be part of, a charged particle beam device which has a retarding field lens or compound lens as objective lens. In other implementations, the magnetic deflection element 360 and the first electrostatic deflection element 330 can be separate elements. As an example, the magnetic deflection element 360 and the first electrostatic deflection element 330 can be positioned at different z-positions.

The example of FIG. 3A shows an arrangement that can be used for a static and a dynamic beam tilt. Dispersion is created in the magnetic deflection element 360 (e.g., an ExB type element) configured for compensating the off-axis chromatic aberration of the objective lens 370. Coma is compensated by the first electrostatic deflection element 330 and the second electrostatic deflection element 340 (double deflectors) generating a penetration through (or near) a coma free point or plane of the objective lens 370. In the case that properties of the objective lens 370 change (e.g. focal length, WD, signal electron extraction field etc.), which will also result in aberration changes, the changes can be re-compensated by dispersion changes and/or adjustments in the z-positions in which the charged particle beam crosses the optical axis 2.

According to some embodiments, which can be combined with other embodiments described herein, the charged particle beam device includes at least one detector 380 provided on the optical axis 2. As an example, the at least one detector 380 can be provided or integrated in the objective lens 370. In another example, the at least one detector 380 can be provided between the first z-position 332 on the optical axis 2 and the charged particle beam emitter. However, the present disclosure is not limited thereto and the at least one detector 380 can be provided at any position on the optical axis 2 suitable for the detection of the signal charged particles. The at least one detector 380 can be configured for detection of the signal charged particles released from the specimen 10 upon impact of the primary charged particle beam. The at least one detector 380 can include at least one of a scintillator, a pin diode or the like. Additionally or alternatively, the charged particle beam device includes at least one detector provided off the optical axis 2 for off-axis detection. The off-axis detector can include at least one of a scintillator, a pin diode or the like.

FIG. 3A illustrates a straight optical axis 2. However, the embodiments of the present disclosure can be used in charged particle beam devices in which a separation between the primary charged particle beam and the signal charged particle beam is provided (e.g. using Wien-filter arrangements).

According to some embodiments, which can be combined with other embodiments described herein, the charged particle beam device is configured to reduce or correct at least one of coma of the objective lens and coma of one or more further coma sources. The one or more further coma sources can include, but are not limited to, at least one of the first electrostatic deflection element 330, the second electrostatic deflection element 340, and a lens of the optical system of the charged particle beam device. In particular, the charged particle beam device can be configured to introduce or correct coma of the objective lens and optionally can be configured to introduce coma to correct other coma sources in a ray path, like coma of the electrostatic deflection elements in the overall tilt configuration and/or other lenses involved in the optical system. In some implementations, the pivot point (e.g., at a position indicated with reference numeral "372" in FIG. 3A) can be selected such that positive and/or negative coma is introduced in the primary charged particle beam passing the objective lens 370 (e.g., positive and/or negative contributions to the overall coma introduced by the objective lens 370). In particular, the pivot point can be selected such that the positive and/or negative coma introduced by the objective lens 370 reduces or corrects coma of the one or more further coma sources. The pivot point can be defined as a point where the primary charged particle beam crosses the optical axis.

Figure 3B:
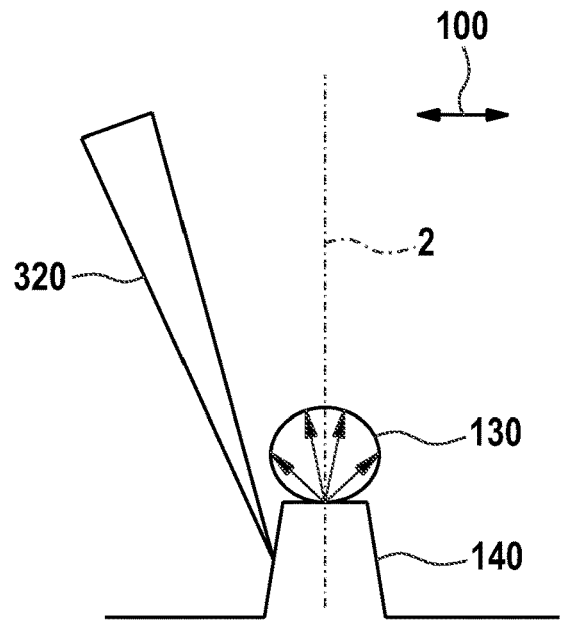
FIG. 3B shows a schematic view of a static beam tilt provided by the charged particle beam device of FIG. 3A according to embodiments described herein.

FIG. 3B shows a schematic view of a static beam tilt provided by the charged particle beam device of FIG. 3A according to embodiments described herein.

In the imaging of 3D structures, a static tilt as well as dynamic tilt (e.g., in a rocking beam imaging) can be used. FIG. 3B shows an imaging of a raising structure 140, e.g., a FinFet, using a static beam tilt. The charged particle beam can be scanned in a scanning direction 100 over the specimen and the 3D structure to be imaged. The scanning direction 100 can be substantially perpendicular to the optical axis 2. The static beam tilt allows for an observation (e.g., beam scanning) under a constant observation angle. The result is an image which gives the impression of looking onto the specimen under a certain angle (incident angle of the charged particle beam).

Figure 4A:
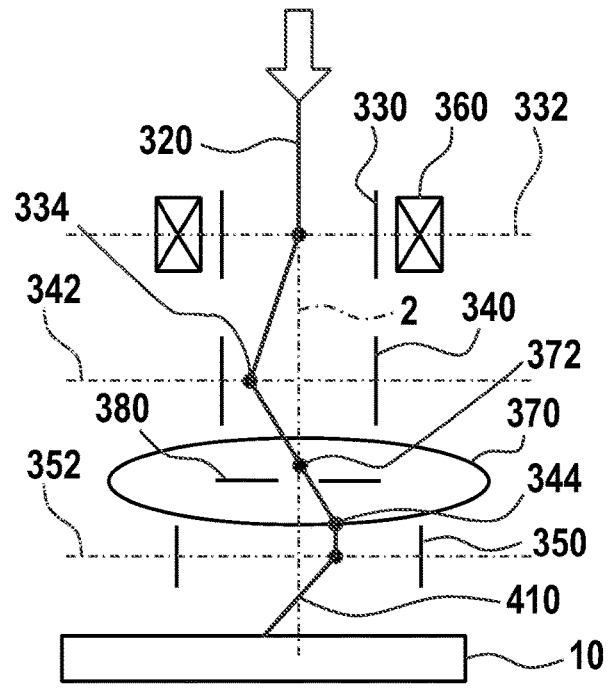
FIG. 4A shows a schematic view of a charged particle beam device according to further embodiments described herein.

FIG. 4A shows a schematic view of a charged particle beam device configured for providing a dynamic beam tilt. The charged particle beam device of FIG. 4A can be similar or identical to the charged particle beam device of FIG. 3A, and the description given with respect to FIG. 3A applies to the embodiment of FIG. 4A.

The charged particle beam device can be configured for providing a dynamic beam tilt. As an example, the charged particle beam can be dynamically tilted in a pivot point 410. The pivot point can be located on the optical axis 2, e.g., in z-direction. In some embodiments, the pivot point 410 can be located between the third electrostatic deflection element 350 and the specimen stage or specimen 10. As an example, the pivot point 410 can be located in front of a surface of the specimen 10. The dynamic beam tilt can, for example, allow for an inspection of deep vias 110. In particular, corner regions of the deep vias 110 can be imaged with high resolution as provided by the embodiments of the present disclosure.

According to some embodiments, which can be combined with other embodiments described herein, the dynamic beam tilt and a scan can be overlaid. In other words, the charged particle beam can be simultaneously scanned over the specimen 10 as illustrated in FIG. 3B and dynamically tilted.

Figure 5A:
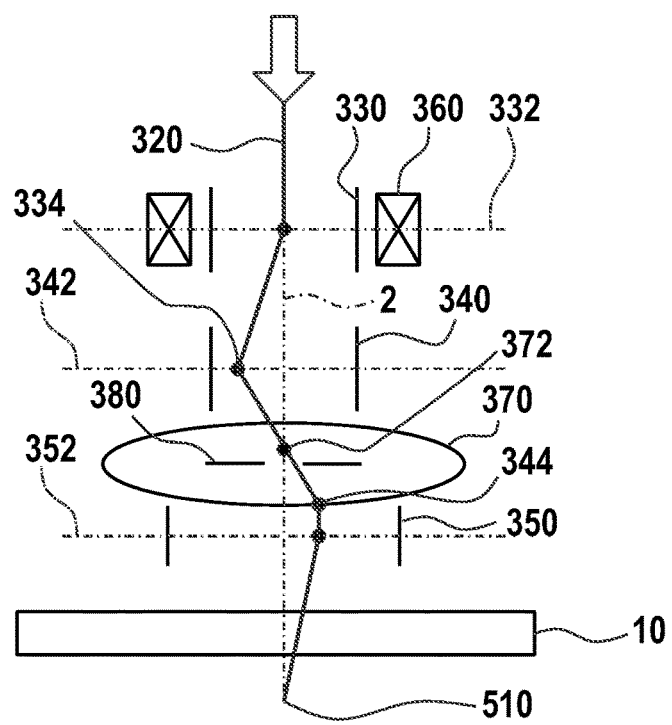
FIG. 5A shows a schematic view of a charged particle beam device according to yet further embodiments described herein.
Figure 5B:
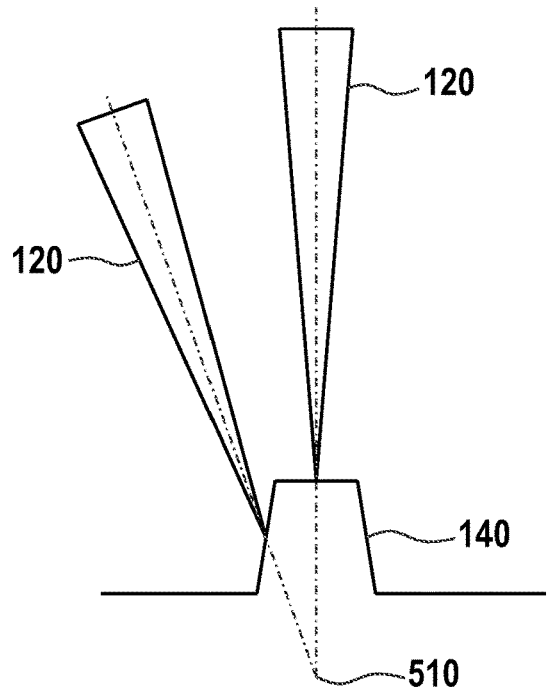
FIG. 5B shows a schematic view of a dynamic beam tilt provided by the charged particle beam device of FIG. 5A according to embodiments described herein.

FIG. 5A shows a schematic view of a charged particle beam device configured for providing a dynamic beam tilt. The charged particle beam device of FIG. 5A can be similar or identical to the charged particle beam devices of FIG. 3A and FIG. 4A, and the descriptions given with respect to FIGS. 3A and 4A apply to the embodiment of FIG. 5A.

Figure 4B:
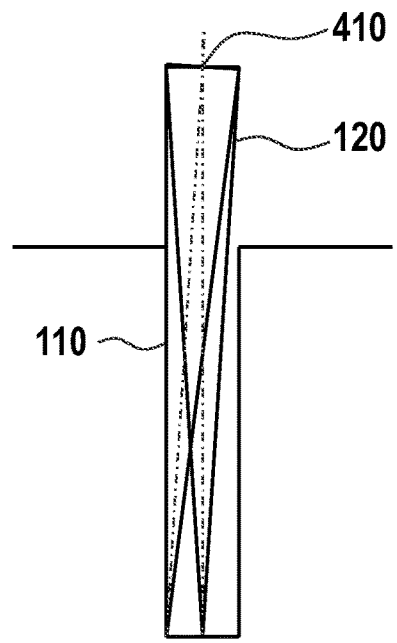
FIG. 4B shows a schematic view of a dynamic beam tilt provided by the charged particle beam device of FIG. 4A according to embodiments described herein.

The charged particle beam device can be configured for providing a dynamic beam tilt, as described with respect to FIGS. 4A and 4B. The pivot point 510 in the example of FIGS. 5A and 5B can be located on the optical axis 2 behind the specimen 10. In particular, the specimen stage or specimen 10 can be located between the third electrostatic deflection element 350 and the pivot point 510. Such a configuration can, for example, allow for an inspection of a raising structure 140. In particular, side walls of the raising structure 140 can be imaged with high resolution as provided by the embodiments of the present disclosure.

According to an aspect of the present disclosure, a charged particle beam device is provided. The charged particle beam device includes a charged particle beam emitter for emitting a primary charged particle beam, a specimen stage for supporting a specimen, an objective lens for focusing the charged particle beam onto the specimen and defining an optical axis providing a z-coordinate, means for tilting the charged particle beam along a beam path, which passes through or near an essentially coma-free z-position of the objective lens and which has a first off-axis position and a second off-axis position, wherein the means for tilting consists of two or more electrostatic deflection elements, wherein at least one deflection element of the two or more deflection elements is a post-lens deflector, and means for compensating off-axis chromatic aberrations, wherein the means for compensating includes at least one magnetic deflection element, wherein the means for tilting the charged particle beam reduces the coma independent of off-axis chromatic aberrations. The charged particle beam device can be configured according to the embodiments described herein, and in particular according to the embodiments described with respect to FIGS. 3 to 6.

The charged particle beam device of the present disclosure is configured for performing the method according to the embodiments described herein. The method of the present disclosure can be implemented using the charged particle beam devices according to the embodiments described herein.

Figure 6:
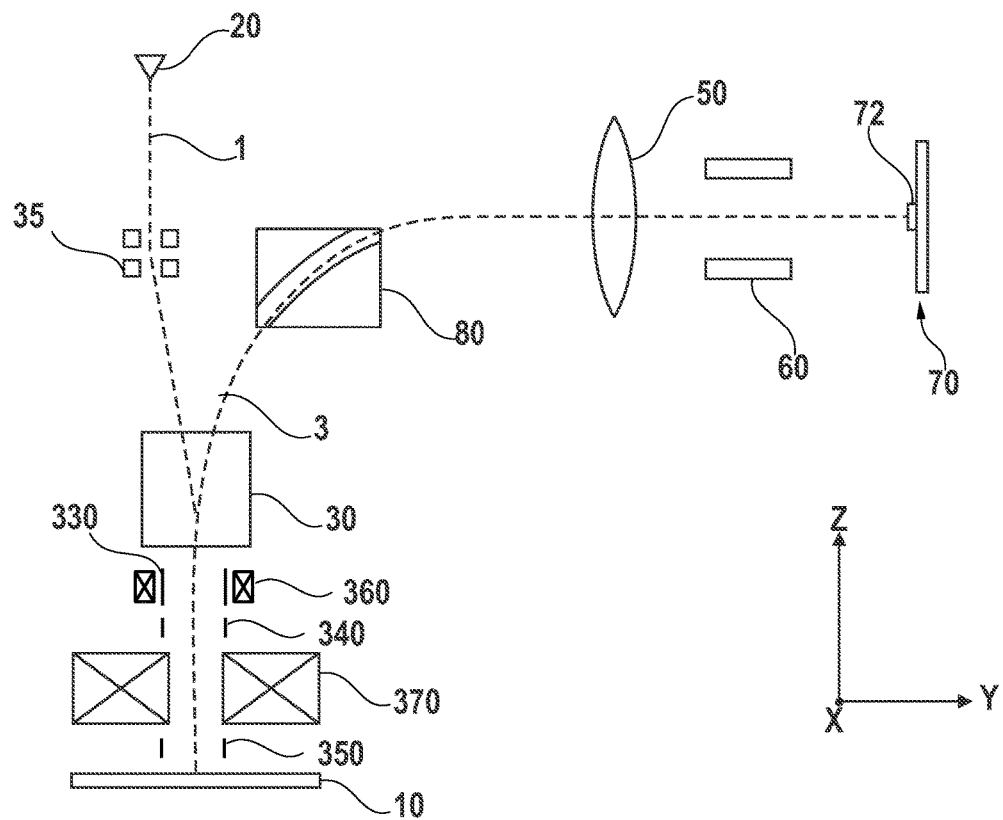
FIG. 6 shows a schematic view of a charged particle beam device according to embodiments described herein.

FIG. 6 shows a schematic view of a charged particle beam device according to embodiments described herein. The charged particle beam device can be, for example, an electron microscope for at least one of electron beam inspection, for defect review or for critical dimensioning. The charged particle beam device includes the first electrostatic deflection element 330, the second electrostatic deflection element 340, the third electrostatic deflection element 350, the magnetic deflection element 360, and the objective lens 370.

The charged particle beam device includes a deflector 35 for deflecting a charged particle beam, such as a primary charged particle beam 1, a beam splitter 30 for separating the primary charged particle beam 1 and a signal charged particle beam 3 formed upon impact on a specimen 10, a signal charged particle deflection device 80, a focusing lens 50 for focusing the signal charged particle beam 3, and at least one detection element 72 for detecting the signal charged particle beam 3. The first electrostatic deflection element 330, the second electrostatic deflection element 340, and the magnetic deflection element 360 are positioned between the beam splitter 30 and the objective lens 370. The third electrostatic deflection element 350 is positioned between the objective lens 370 and the specimen 10.

The charged particle beam device includes a charged particle beam emitter 20 producing the primary charged particle beam 1 which is directed towards the specimen 10 through the objective lens 370. Signal charged particles, such as secondary electrons (SE), released from or backscattered from the specimen 10 form the signal charged particle beam 3 carrying information about the specimen 10. The information can include information about the topography of the specimen 10, chemical constituents, electrostatic potential, and others.

The signal charged particle beam 3 is separated from the primary charged particle beam 1 by means of the beam splitter 30 and enters the signal charged particle deflection device 80. The signal charged particle deflection device can include, for example, a beam bender, such as a hemispherical or sector beam bender.

The signal charged particle deflection device 80 deflects the signal charged particle beam 3 towards the focusing lens 50. The focusing lens 50 focuses the signal charged particle beam 3 on the at least one detection element 72 or sensor (scintillator, pin diode etc.) of a detector assembly 70. A deflector 60 can be provided between the focusing lens 50 and the detector assembly 70, e.g., to adjust a path of the signal charged particle beam 3 towards the detector assembly 70. The deflector 60 can improve an alignment of the signal charged particle beam 3 to an optical axis of the signal charged particle optics.

The charged particle beam device can be configured according to the embodiments described with respect to FIGS. 3 to 6. The charged particle beam device can be particularly configured for performing the method according to the embodiments described herein.

Figure 7:
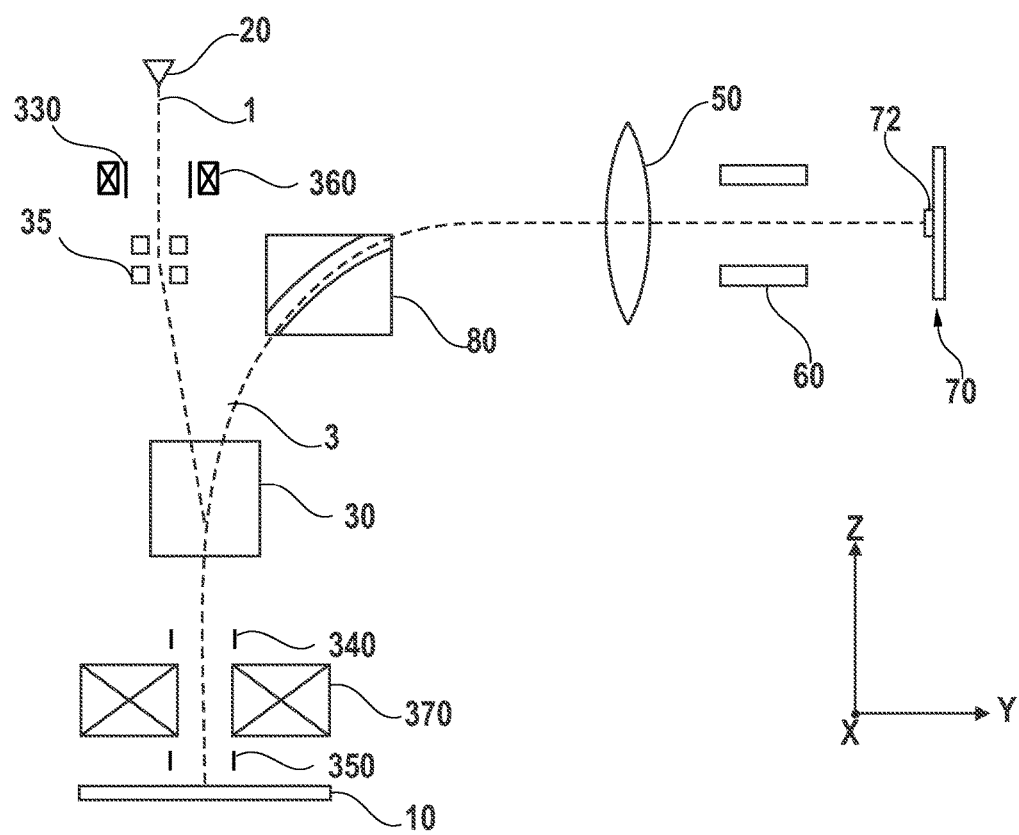
FIG. 7 shows a schematic view of a charged particle beam device according to further embodiments described herein.

FIG. 7 shows a schematic view of a charged particle beam device according to further embodiments described herein. The charged particle beam device of FIG. 7 is similar to the charged particle beam device of FIG. 6, the difference being the position of the magnetic deflection element 360 and the first electrostatic deflection element 330.

According to some embodiments, which can be combined with other embodiments described herein, at least one of the first electrostatic deflection element 330, the second electrostatic deflection element 340, and the magnetic deflection element 360 is positioned between the beam splitter 30 and the charged particle beam emitter 20. In the example of FIG. 7, the magnetic deflection element 360 and the first electrostatic deflection element 330 are positioned between the beam splitter 30 and the charged particle beam emitter 20. However, the present disclosure is not limited thereto and, for example, only the first electrostatic deflection element 330, only the magnetic deflection element 360, or only the second electrostatic deflection element 340 can be positioned between the beam splitter 30 and the charged particle beam emitter 20. The deflection elements that are not positioned between the beam splitter 30 and the charged particle beam emitter 20 can be positioned between the beam splitter 30 and the objective lens 370. In another example, the first electrostatic deflection element 330, the second electrostatic deflection element 340, and the magnetic deflection element 360 are positioned between the beam splitter 30 and the charged particle beam emitter 20. In other words, the first electrostatic deflection element 330, the second electrostatic deflection element 340, and/or the magnetic deflection element 360 can be positioned only in the path of the primary charged particle beam. In some embodiments, at least one of the first electrostatic deflection element 330, the second electrostatic deflection element 340, and the magnetic deflection element 360 is integrated or combined with the deflector 35. As an example, the first electrostatic deflection element 330 and the magnetic deflection element 360 are integrated or combined with the deflector 35.

The present disclosure provides a method and a charged particle beam device that use electrostatic deflection elements and a magnetic deflection element for independently reducing coma and chromatic aberration, respectively. The electrostatic deflection elements guide the charged particle beam (e.g., the primary charged particle beam) through an essentially coma-free z-position of an objective lens to reduce the coma. The magnetic deflection element introduces a compensating dispersion in the charged particle beam to reduce the chromatic aberration. Reducing the coma and chromatic aberration particularly provides for an improved resolution of the charged particle beam device.

While the foregoing is directed to embodiments of the disclosure, other and further embodiments of the disclosure may be devised without departing from the basic scope thereof, and the scope thereof is determined by the claims that follow.

The invention claimed is:

1. A method of reducing coma and chromatic aberration in a charged particle beam device for providing a dynamic beam tilt of a charged particle beam, comprising:
   tilting the charged particle beam with a deflection assembly consisting of two or more electrostatic deflection elements, wherein at least one deflection element of the two or more deflection elements is a post-lens deflector, while the charged particle beam is guided through an essentially coma-free z-position of an objective lens;
   reducing off-axis chromatic aberrations introduced within the objective lens, using a magnetic deflection element disposed between the objective lens and a charged particle beam emitter, wherein tilting the charged particle beam reduces the coma independent of the off-axis chromatic aberrations; and
   separating, by a beam splitter, the charged particle beam and a signal charged particle beam which is collected by the objective lens and guided to a sensor, the signal charged particle beam being released from or backscattered from a specimen;
   wherein the charged particle beam is dynamically tilted in a pivot point; and
   wherein the pivot point is located on the optical axis between a third electrostatic deflection element and the specimen or specimen stage, or the pivot point is located such that the specimen or specimen stage is located between the third electrostatic deflection element and the pivot point.

2. The method of claim 1, wherein the objective lens defines an optical axis providing a z-coordinate, and wherein tilting the charged particle beam includes:
   deflecting the charged particle beam away from the optical axis to a first off-axis position by a first electrostatic deflection element at a first z-position, wherein the first z-position is between a charged particle beam emitter and the objective lens.

3. The method of claim 2, wherein tilting the charged particle beam includes:
   deflecting the charged particle beam from the first off-axis position to a second off-axis position by a second electrostatic deflection element at a second z-position, wherein the second off-axis position is in the objective lens, and wherein the optical axis is between the first off-axis position and the second off-axis position.

4. The method of claim 3, wherein tilting the charged particle beam includes:
deflecting the charged particle beam by a third electrostatic deflection element at a third z-position, wherein the third z-position is between the objective lens and a specimen stage.

5. The method of claim 1, wherein reducing the off-axis chromatic aberrations with the magnetic deflection element includes:
introducing a compensating dispersion by the magnetic deflection element, which reduces the chromatic aberration introduced within the objective lens.

6. The method of claim 1, wherein a beam tilt angle of the charged particle beam with respect to an optical axis after the objective lens is in a range of 5 to 30 degrees.

7. A charged particle beam device configured for performing the method according to claim 1.

8. The method of claim 1, wherein the charged particle beam device images a V-NAND device, FinFet, and/or deep via.

9. The method of claim 1, wherein the third electrostatic deflection element is disposed between the objective lens and the specimen or specimen stage.

10. A charged particle beam device, comprising:
a charged particle beam emitter for emitting a charged particle beam;
a specimen stage for supporting a specimen;
an objective lens for focusing the charged particle beam onto the specimen and defining an optical axis providing a z-coordinate;
a first electrostatic deflection element at a first z-position, wherein the first z-position is between the charged particle beam emitter and the objective lens, wherein the first electrostatic deflection element is an n-pole with n≥4, wherein the first electrostatic deflection element deflects the charged particle beam away from the optical axis to a first off-axis position;
a second electrostatic deflection element at a second z-position, wherein the second z-position is between the first z-position and an essentially coma-free z-position provided by the objective lens, wherein the second electrostatic deflection element is an n-pole with n≥8, and wherein the second electrostatic deflection element deflects the charged particle beam from the first off-axis position to a second off-axis position, wherein the optical axis is between the first off-axis position and the second off-axis position;
a third electrostatic deflection element at a third z-position, wherein the third z-position is between the objective lens and the specimen stage, wherein the third electrostatic deflection element is an n-pole with n≥4;
a magnetic deflection element, which is provided between the objective lens and the charged particle beam emitter, wherein the magnetic deflection element is an n-pole with n≥4, wherein the magnetic deflection element introduces a compensating dispersion, which reduces a chromatic aberration introduced by the second off-axis position of the charged particle beam within the objective lens, and wherein the first electrostatic deflection element, the second electrostatic deflection element, and the third electrostatic deflection element introduce a tilting of the charged particle beam that reduces coma independent of the chromatic aberration;
a beam splitter for separating the charged particle beam and a signal charged particle beam; and
a specimen including a V-NAND device, FinFet, and/or deep via.

11. The charged particle beam device of claim 10, wherein the magnetic deflection element is positioned at the first z-position.

12. The charged particle beam device of claim 10, wherein the magnetic deflection element surrounds the first electrostatic deflection element.

13. The charged particle beam device of claim 10, wherein the objective lens comprises a retarding field lens or a compound lens.

14. The charged particle beam device of claim 10, wherein the coma-free z-position is a position provided by the objective lens at which minimum coma is introduced in the charged particle beam when the charged particle beam passes through the objective lens.

15. The charged particle beam device of claim 14, wherein the first electrostatic deflection element and the second electrostatic deflection element are configured for guiding the charged particle beam through the coma-free z-position of the objective lens.

16. The charged particle beam device of claim 10, wherein at least one of the first electrostatic deflection element, the second electrostatic deflection element and the third electrostatic deflection element is configured for statically or dynamically scanning the charged particle beam over the specimen.

17. The charged particle beam device of claim 10, further comprising a detector provided on the optical axis, wherein the detector is provided or integrated in the objective lens, or wherein the detector is provided between the first z-position on the optical axis and the charged particle beam emitter.

18. The charged particle beam device of claim 10, further comprising a detector provided off the optical axis for off-axis detection.

19. A charged particle beam device, comprising:
a charged particle beam emitter for emitting a primary charged particle beam;
a specimen stage for supporting a specimen;
an objective lens for focusing the charged particle beam onto the specimen and defining an optical axis providing a z-coordinate;
means for tilting the charged particle beam along a beam path, which passes through or near an essentially coma-free z-position of the objective lens and which has a first off-axis position and a second off-axis position, wherein the means for tilting consists of two or more electrostatic deflection elements, wherein at least one deflection element of the two or more deflection elements is a post-lens deflector;
means for compensating off-axis chromatic aberrations introduced within the objective lens, wherein the means for compensating comprises at least one magnetic deflection element;
a beam splitter for separating the charged particle beam and a signal charged particle beam; and
a specimen including a V-NAND device, FinFet, and/or deep via;
wherein the means for tilting the charged particle beam reduces a coma independent of the off-axis chromatic aberrations.

20. The charged particle beam device of claim 19, wherein the charged particle beam device is an electron microscope for at least one of electron beam inspection, for defect review or for critical dimensioning.

21. A method of reducing coma and chromatic aberration in a charged particle beam device for providing a dynamic beam tilt of a charged particle beam, comprising:
  tilting the charged particle beam with a deflection assembly consisting of two or more electrostatic deflection elements, wherein at least one deflection element of the two or more deflection elements is a post-lens deflector, while the charged particle beam is guided through an essentially coma-free z-position of an objective lens;
  reducing off-axis chromatic aberrations introduced within the objective lens with a magnetic deflection element disposed between the objective lens and a charged particle beam emitter, wherein tilting the charged particle beam reduces coma independent of the off-axis chromatic aberrations; and
  separating, by a beam splitter, the charged particle beam and a signal charged particle beam which is collected by the objective lens and guided to a sensor, the signal charged particle beam being released from or backscattered from the specimen, wherein the charged particle beam is dynamically tilted in a pivot point located on the optical axis between the post-lens deflector and the specimen or specimen stage, or the pivot point is located such that the specimen or specimen stage is located between the post-lens deflector and the pivot point.

22. The method of claim 21, wherein the post-lens deflector is disposed between the objective lens and the specimen or specimen stage.

23. The method of claim 21, wherein at least one of the two or more electrostatic deflection elements and the magnetic deflection element are positioned between the beam splitter and the charged particle beam emitter.

* * * * *